(12) United States Patent
Tennant et al.

(10) Patent No.: US 7,368,762 B2
(45) Date of Patent: May 6, 2008

(54) HETEROJUNCTION PHOTODIODE

(75) Inventors: William E. Tennant, Thousand Oaks, CA (US); Eric C. Piquette, Camarillo, CA (US); Donald L. Lee, Thousand Oaks, CA (US); Mason L. Thomas, Moorpark, CA (US); Majid Zandian, Calabasas, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 192 days.

(21) Appl. No.: 11/031,803

(22) Filed: Jan. 6, 2005

(65) Prior Publication Data
US 2007/0034898 A1 Feb. 15, 2007

(51) Int. Cl.
*H01L 31/00* (2006.01)
(52) U.S. Cl. ............ 257/184; 257/186; 257/188; 257/189; 257/199; 257/481; 257/485; 257/E31.054; 257/E31.065; 257/E31.067
(58) Field of Classification Search ............ 257/184, 257/189, 449, 450, 453, 461, E31.065, E31.067, 257/21, 185, 188, 190, 441, 442, 443, E31.015, 257/E31.018, E31.058, 186, 199, 481, 485, 257/E31.054
See application file for complete search history.

(56) References Cited

U.S. PATENT DOCUMENTS

| | | | | |
|---|---|---|---|---|
| 3,958,143 A * | 5/1976 | Bell | ............ | 313/542 |
| 4,195,305 A * | 3/1980 | Moon | ............ | 257/191 |
| 4,390,889 A * | 6/1983 | Capasso et al. | ............ | 257/189 |
| 4,961,098 A | 10/1990 | Rosbeck et al. | ............ | 357/30 |
| 5,012,083 A | 4/1991 | Chu | ............ | 250/211 |
| 5,016,073 A | 5/1991 | Elliott et al. | ............ | 357/30 |
| 5,241,196 A | 8/1993 | Huang et al. | ............ | 257/185 |
| 5,300,777 A * | 4/1994 | Goodwin | ............ | 250/338.4 |
| 5,880,510 A | 3/1999 | Cockrum et al. | ............ | 257/442 |
| 6,034,407 A | 3/2000 | Tennant et al. | ............ | 257/440 |
| 6,803,557 B1 * | 10/2004 | Taylor et al. | ............ | 250/214.1 |

FOREIGN PATENT DOCUMENTS

EP  0109855 A2  5/1984

(Continued)

OTHER PUBLICATIONS

HgCdTe Infrared Detectors, P. Norton, USA, Opto-Electronics Review 10(3), 159-174 (2002).

(Continued)

*Primary Examiner*—Minhloan Tran
*Assistant Examiner*—Benjamin Tzu-Hung Liu
(74) *Attorney, Agent, or Firm*—Koppel, Patrick, Heybl & Dawson

(57) ABSTRACT

The present invention provides a heterojunction photodiode which includes a pn or Schottky-barrier junction formed in a first material region having a bandgap energy $E_{g1}$. When reverse-biased, the junction creates a depletion region which expands towards a second material region having a bandgap energy $E_{g2}$ which is less than $E_{g1}$. This facilitates signal photocurrent generated in the second region to flow efficiently through the junction in the first region while minimizing the process-related dark currents and associated noise due to near junction defects and imperfect surfaces which typically reduce photodiode device performance. The heterojunction photodiode can be included in an imaging system which includes an array of junctions to form an imager.

12 Claims, 4 Drawing Sheets

FOREIGN PATENT DOCUMENTS

GB          2085655 A      4/1982
WO       WO 0249117 A    6/2002

OTHER PUBLICATIONS

Zimmerman, P. H. et al.; "Surface Passivation of HGCDTE Photodiodes"; Journal of Vacuum Science and Technology: Part A, AVS/AIP, Melville, NY; vol. 8; No. 2; Mar. 1, 1990; pp. 1182-1184.

PCT International Search Report; Nov. 27, 2007; in International Application No. PCT/US2006/000159; 4 pp.

PCT Written Opinion of the International Searching Authority; Nov. 27, 2007; in International Application No. PCT/US2006/000159; 7 pp.

* cited by examiner

HETEROJUNCTION PHOTODIODE

BACKGROUND OF THE INVENTION

1. Field of the Invention

This invention relates generally to optoelectronic devices and, more particularly, to infrared photodiode photodetectors.

2. Description of the Related Art

Photodetectors are used in numerous applications to detect light and provide a corresponding electrical signal. Infrared (IR) photodetectors are one class of detectors which are included in a variety of applications, such as night vision, communications, and environmental monitoring. IR detectors can be based on several different material systems, including silicon (Si), gallium arsenide (GaAs), silicon germanium (SiGe), aluminum gallium arsenide (AlGaAs), lead salts (PbS, PbSeTe, PbSnTe), various Hg-bearing compounds, pseudobinary alloys of HgTe and HgSe with CdTe, CdSe, MnTe, MnSe, ZnTe, and ZnSe. Mercury cadmium telluride (HgCdTe or MCT) is attractive because it has a direct energy gap, can be grown as high-quality epitaxial thin films on transparent substrates, can be doped to obtain both high and low carrier concentrations, and spans the entire IR wavelength range from ~0.8 µm to >20 µm. It can also be compositionally graded to vary the bandgap energy with position. More information regarding MCT photodetectors can be found, for example, in U.S. Pat. No. 6,034,407.

Photodiodes provide the highest performance of all photodetectors. A photodiode consists of a semiconductor pn junction. The semiconductor absorbs light having photon energy higher than the semiconductor's bandgap, creating electron-hole pairs. If the light is absorbed in the n(p)-region, the holes (electrons) are the minority carriers and diffuse to the depletion region, where they are swept by the depletion region electric field into the p(n)-region to create a photocurrent that becomes the detector signal. Absorption of light in the depletion region produces this sweeping without need for diffusion.

The fundamental quality of a detector is its signal-to-noise ratio (SNR); i.e., the ratio of the photocurrent to the noise current present in the detector under measurement conditions. The highest quality a detector can have in any operating condition is to have a SNR limited by the noise current that comes from the photon background itself. This condition is called "background-limited performance" or BLIP. The highest BLIP quality is attained when every absorbed photon generates a minority carrier that contributes to the photocurrent. The efficiency of minority carrier collection is called the quantum efficiency, and perfect detectors will have a quantum efficiency of 1. Note that if the light is absorbed in a material of relatively low bandgap, but the pn-junction is in a portion of the semiconductor structure with a wide bandgap (i.e., if the structure is a type of "heterostructure" having spatially varying energy gaps), under some conditions an energy barrier exists that frustrates diffusion of minority carriers to the depletion region and significantly reduces the photocurrent.

Current MCT detector technology does not operate near its full potential. One reason is because of point and extended defects in the material, which can be caused by impurities or vacancies, imperfect surfaces, interfaces, or damage introduced during fabrication. These defects can cause recombination of any minority carrier in their vicinity, in particular those photogenerated carriers that produce the detector signal. This recombination decreases the detector quantum efficiency.

The defects mentioned above may also cause the detectors to have too much noise. Dark current, which is a current that flows through the photodetector in the absence of incident light, adds noise to that inherent in the photocurrent, lowering the SNR below the BLIP level. The dark current is caused by the thermal generation or tunneling of charge carriers due to fundamental mechanisms, to point defects, or to extended defects. It is generally desired to have the photodetector provide its maximum (BLIP) sensitivity at as high at temperature as possible, up to room temperature to avoid the need for elaborate cooling schemes. However, the thermally generated dark current-induced noise typically increases exponentially with increasing operating temperature. Consequently, there is a need for a photodetector with fewer defects near the active region so that, at a given temperature, the quantum efficiency is improved and the defect-generated noise is reduced.

Dark currents are lower in materials with higher ("wider") energy gaps than those in materials with lower ("narrower") gaps. This is because the defects can only generate dark currents in proportion to the equilibrium concentration of minority carriers in the semiconductor, and because this concentration for fundamental physical reasons is exponentially lower in higher energy gap materials. Therefore, one expects the dark currents from defects to be reduced greatly in wide bandgap materials compared to their currents in narrow gap materials. Roughly, for a given level of defect-moderated and fundamental mechanisms, the same dark current density will be realized for a given ratio of energy gap to temperature.

SUMMARY OF THE INVENTION

The present invention provides a heterojunction photodiode which includes a pn junction formed in, or a Schottky-barrier junction formed on, a first wide bandgap material region. When reverse-biased, the depletion region of the junction expands towards a second narrow bandgap material region, lowering the built-in barrier due to the heterostructure and allowing photocurrent to be generated efficiently. The dark current is reduced compared to non-heterojunction devices because most process-induced defects and the highest fields of the depletion region are located in the wide bandgap region which has inherently low dark current, while the incident light is absorbed in the narrow field region where defects are few and applied fields are low. This lower dark current also reduces the noise in the total current flowing through the junction. The heterojunction photodiode can be included in an imaging system which includes an array of junctions to form an imager.

These and other features, aspects, and advantages of the present invention will become better understood with reference to the following drawings, description, and claims.

DETAILED DESCRIPTION OF THE INVENTION

Figure 1:
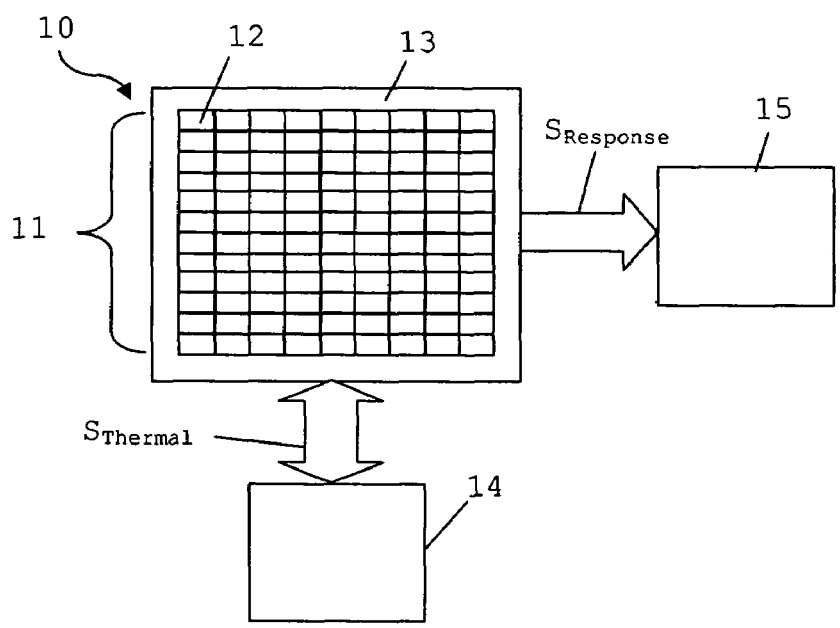
FIG. 1 is a simplified top view of an imaging system in accordance with the present invention.

FIG. 1 is a simplified top view of an imaging system 10 which includes an array 11 of pn or Schottky-barrier photodiodes 12 (interchangeably referred to herein as "photodetectors"). The photodetectors in array 11 are formed on a substrate 13, although they could be formed individually and mounted on a support structure. System 10 can be included, for example, in a focal plane array (FPA), which is an optical sensor placed at the focal plane of an optical system such as a camera, spectrometer, or telescope. In these applications, the FPA is typically sensitive to ultraviolet, visible, or infrared radiation, although other wavelengths may also be detected.

System 10 would typically include circuitry 15 coupled to array 11. Circuitry 15 could include a read-out integrated circuit or a multiplexer which provides electronic access to the pixels in array 11. In response to the image detected, array 11 provides a signal $S_{Response}$ to circuitry 15 for image processing. Circuitry 15 can be external to system 10, or it can be integrated with other components on substrate 13, such as array 11.

The junctions of photodiodes 12 can be formed as pn junctions by numerous well-known methods, including ion implantation, diffusion doping, or by doping during growth. Alternatively, they can be formed as Schottky barrier junctions by depositing any of several metals or semi-metals on the heterostructure. Typically suitable metals would be ones with a large work function, such as Au, Pt, Pd, or other metals known to those in the field. Semimetals such as HgTe may also make appropriate Schottky barriers.

Following the junction formation process, which typically includes a delineation step, passivation is used to protect the delicate junction from its environment, and metallization allows a contacting of the junction to external circuitry. The delineation process and layer bandgap profiles are chosen to allow surface passivation of the junction perimeter to be applied entirely in the region in which the junction is formed. In general, these process steps, in addition to performing their intended functions, create a number of point and extended defects, which increase the amount of undesired recombination and dark currents in the detector structure. For example, ion implantation increases the number of point defects because it causes damage to the lattice which often results in vacancies, interstitial atoms, dislocation loops, and microscopic voids. Passivation can induce surface deficiencies of cadmium and mercury, impurities, and amorphous or polycrystalline structures.

To reduce the effect of defects on quantum efficiency and dark current, the present photodiode is formed so that the depletion region formed when the device is reverse-biased extends away from the regions of the device with the most defects, which are typically near its surface. Moreover, these higher defect regions are confined in wider bandgap material placed near the surface to suppress the effects of defects. During implantation, for example, the implanted ions flow through the surface and into the near-surface wide bandgap material, such that the highest concentration of damage is near the surface in the widest bandgap material.

The present photodiode's structure (discussed in detail below) comprises a pn or Schottky-barrier junction formed in a wide bandgap material region, with a second material region of relatively narrow bandgap positioned adjacent to the wide bandgap region. Processed and passivated surfaces, which are notorious sources of excess currents, are located in the wide bandgap material in which the junction of the present photodiode is formed. Hence, in operation it is desired to have the narrowest bandgap region where the the incident signal photons are absorbed to be in a region away from these defects. Without the heterostructure, this narrow bandgap region would be the most susceptible to defect and field-induced excess currents. Controlling the depletion region to extend from the wider bandgap region just into the narrow gap region minimizes the excess dark current. For some devices, additional benefit may be gained by increasing the bias to extend the depletion region through the narrowest bandgap region, for example to minimize the dark currents associated with fundamental Auger recombination processes. One way in which the depletion region is controlled is by applying a reverse bias to detector 12 so that the depletion region extends just into the narrow gap region. Hence, the characteristics of the reverse bias can be used to control the size and positioning of the depletion region and, consequently, the photocurrent.

Figure 2:
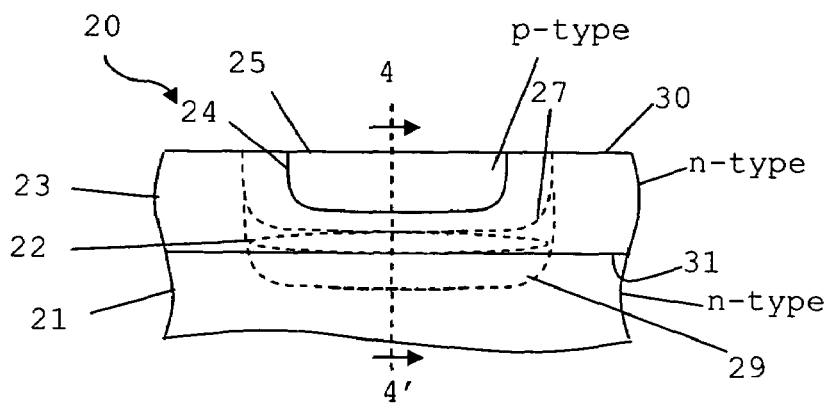
FIG. 2 is a simplified sectional view of a pn diode with a depletion region in accordance with the present invention.

FIG. 2 is a simplified sectional view of a pn junction 20 in accordance with the present invention. Junction 20 can be included in photodiode 12 and can have a region 21 onto which a cap region 23 with a surface 30 is positioned. In this embodiment, region 23 has a bandgap energy $E_{g1}$ and region 21 has a bandgap energy $E_{g2}$ in which $E_{g1}>E_{g2}$. For example, regions 21 and 23 can include mercury cadmium telluride (HgCdTe) and cadmium telluride (CdTe), respectively, or alloys thereof. Regions 21 and 23 are doped n-type, but region 23 includes a p-type region 25, with the interface between the n-type portion of region 23 and region 25 forming a pn junction 24. P-type region 25 can be formed by ion implantation or diffusion doping, or it can be doped during growth as discussed above (in which case the region is isolated by a mesa etch through the p-region making the surface 30 stepped rather than planar, but still entirely located in regions 23 and 25). Note that, though regions 21 and 23 are shown and discussed herein as n-type and region 25 is shown and discussed herein as p-type, the invention also contemplates opposite polarity structures, in which regions 21 and 23 are p-type and region 25 is n-type.

The presence of pn junction 24 creates a depletion region 27 in the n-type portion of region 23 under zero bias. Hence, depletion region 27 and potentially (depending on the magnitude of the built-in field which is determined by the doping level and the bandgap profile) an undepleted n-type portion 22 of region 23 separate regions 21 and 25 under zero bias. Because $E_{g1}>E_{g2}$, any undepleted n-type portion 22 which is present forms a heterojunction barrier between regions 21 and 25, so that if a forward bias is applied to pn junction 24, depletion region 27 moves towards region 25 and barrier region 22 increases in size. This decreases the photocurrent flow through junction 24 that results from the optical absorption of photons by diode 20.

However, when a reverse bias is applied to pn junction 24, depletion region 27 moves away from region 25 and barrier region 22 decreases in size. This increases the photocurrent flow through junction 24, and extends the depletion region away from surface 30 and any defects that may be near the surface. If the reverse bias is large enough, depletion region 27 is extended into region 21 as indicated by depletion region 29. When there is just enough reverse bias to eliminate barrier region 22 to minority carriers, the quantum efficiency attains its maximum value, while the dark current is small—determined essentially by the near-ideal properties of the narrow bandgap absorber layer. If the absorber layer dark currents are limited by fundamental Auger recombination, further dark current reduction can be obtained in principle by increasing the bias until the depletion region extends throughout the entire absorber layer. Compared to a homojunction, this architecture provides reduced non-radiative recombination, increased carrier lifetime and quantum efficiency, reduced dark current and reduced noise. This highest quantum efficiency and lowest dark current is the condition required for optimum detection, limited only by fundamental absorber layer processes and not by process-induced defects associated with the surface or the junction formation.

Figure 3:
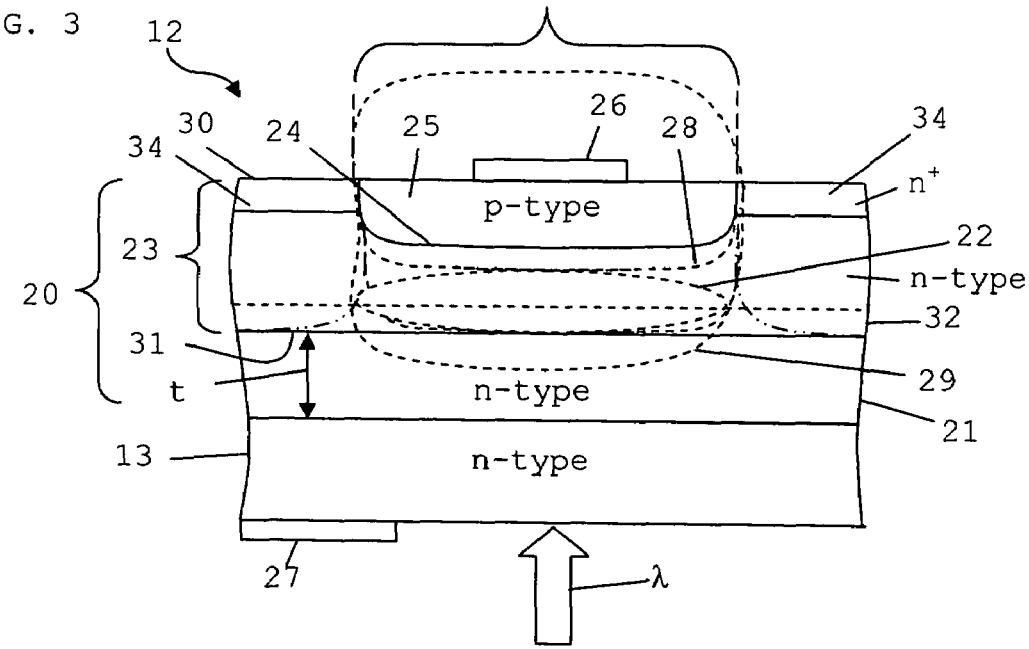
FIG. 3 is a simplified sectional view of a heterojunction photodiode with the pn diode illustrated in FIG. 2.

FIG. 3 is a sectional view of an embodiment of photodiode 12 which includes pn diode 20 of FIG. 2. In this example, diode region 21 is positioned on substrate 13, which is typically doped to have the same conductivity type as region 21 (here, n-type). Photodiode 12 is back illuminated so that light with wavelength λ is incident on the lower surface of region 21 through the optically transparent substrate 13. Light absorbed in region 21 creates minority carriers (here, holes), which diffuse (or drift if the depletion region extends far enough) to junction 24 through region 21. Thus, most of the absorption will occur away from surface 30 as discussed above. Note that the substrate 13 may itself be an epitaxial layer of larger energy gap than that of layer 21 and grown on an even wider bandgap substrate of potentially a significantly different materials system.

Contacts 26 and 27 are positioned on region 25 and substrate 13, respectively, so that diode 20 can be biased by applying a potential difference between them. The bias can be provided from circuitry 15 in FIG. 1, or from other external electronic circuitry (not shown). Preferably, contacts 26 and 27 include metal which forms ohmic contacts to region 25 and substrate 13, respectively. Alternatively, contacts 26 and 27 can form Schottky contacts with their respective contact regions. Cap region 23 can include an optional $n^+$-doped region 34 adjacent to surface 30 to prevent surface 30 from inverting when a reverse bias is applied between contacts 26 and 27 or due to imperfect passivation.

There can be several variations of the structure and material properties of the regions included in photodiode 12 to improve its performance and reduce noise. Region 23 can be lightly-doped n-type so that barrier region 22 can be fully depleted at relatively low biases. Region 23 can also have a compositional grading so that its bandgap energy approaches that of region 21 near an interface 31 between regions 21 and 23. By positioning pn junction 24 in wider bandgap material region 23 and by lightly doping region 22, Auger recombination is reduced. Auger recombination in diode 20 can be further reduced if region 21 is lightly doped n-type so that depletion region 29 can extend far into (or through) it, minimizing Auger-recombination. Thickness t of region 21 can be made thin for long wavelength infrared applications so that it can be fully depleted by junction 24, which allows high performance operation at or near room temperature. Also, junction 24 can be formed at or near interface 31 so that region 22 is thin when detector 19 is not biased. This allows the detection of smaller photocurrents.

An optional graded n-buffer region 32 can be positioned adjacent to interface 31, and junction 24 can be positioned slightly into buffer region 32 if the p-doping of region 25 is sufficiently low. Buffer region 32 is an optional feature which can be provided to improve the material quality of region 23 and to improve the lattice match between regions 21 and 23. In addition to having a larger energy gap due to differing HgCdTe composition, buffer region 32, as well as region 23, can include zinc (Zn), manganese (Mn), and/or selenium (Se), for example.

Diode 20 can be defined by etching an optional mesa 33 into region 23. By defining mesa 33 before diffusion doping or annealing any implantation damage, region 22 can be reduced because the dopants will partially diffuse towards region 21 instead of laterally along interface 31. In this way, junction 24 will be very close to interface 31. Positioning junction 24 in a mesa formed in region 23 also allows the junction to be delineated from a sheet of p-doped material (grown or implanted) in the first region while facilitating passivation (via the wider bandgap in the first region). This mesa delineation step, if done prior to anneal (and any anneal-associated dopant diffusion or compositional interdiffusion), has advantages in improved process control, and allows minimal delineation etch depth, thus preserving the majority of region 23 and associated performance advantages of the device as described, and in particular facilitating surface passivation. The option of delineation after anneal is also considered as part of this invention. However, mesa 33 is an optional feature which can be used for the above reason and/or to provide carrier confinement.

Figure 4:
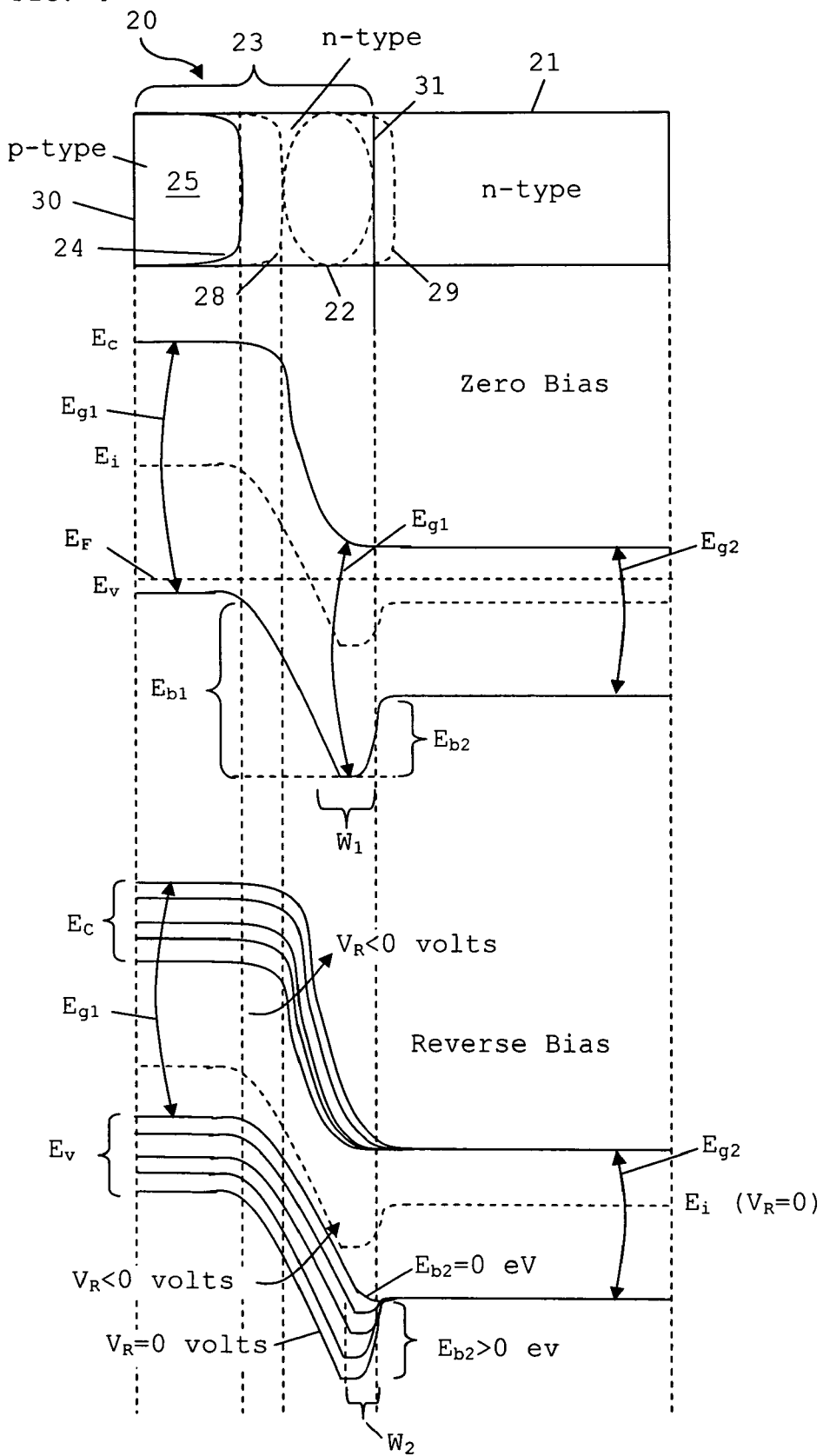
FIG. 4 is a graph showing the energy bands as a function of depth from the top surface of the device at various bias conditions for the heterojunction photodiode of FIG. 3.

FIG. 4 is a simplified sectional view along a cut line 4-4' of pn diode 20 (turned 90°) in FIG. 3, and the diode's corresponding simplified energy band diagrams under zero and reverse bias conditions. In an energy band diagram, the bandgap energy is the difference between the conduction band energy $E_c$ and the valence band energy $E_v$. The intrinsic energy $E_i$ is the Fermi energy $E_F$ corresponding to a nominally undoped material, or a material with an equal number of electron and holes. The Fermi energy $E_F$ is the energy level where the probability of occupation by a charge carrier (i.e. electron or hole) is equal to one-half.

As is well-known in the art, the positioning of $E_F$ relative to $E_c$, $E_v$, and $E_i$ is indicative of the conductivity of the material. If $E_F$ is between $E_c$ and $E_i$, then the material is n-type and if $E_F$ is between $E_i$ and $E_v$, then the material is p-type. Hence, in region 25, $E_F$ is close to $E_v$ because this region is p-type, and in region 21, $E_F$ is close to $E_c$ because this region is n-type.

Hence, under equilibrium conditions (i.e. zero bias), $E_F$ transitions from being close to $E_v$ in region 25 to close to $E_c$ in the n-type portion of region 23. $E_c$ and $E_v$ bend downward at the pn junction interface to create a built-in potential $E_{b1}$. Under zero bias conditions, energy $E_{b1}$ will behave as a barrier to holes flowing from region 25 to the n-type portion of region 23. At the interface between the n-type portion of region 23 and region 21, $E_v$ will bend upwards, since $E_{g1} > E_{g2}$ and region 23 is n-type. This will create a built-in potential $E_{b2}$ which will behave as a barrier to holes flowing from region 21 to region 25. Hence, a barrier to holes, with a width $W_1$, is formed between regions 21 and 25 under equilibrium conditions.

When pn junction 24 is reverse biased, however, depletion region 28 moves towards interface 31. This decreases the height of the barrier $E_{b2}$ to 0 eV and increases the probability that holes will flow from region 21 through pn diode 20, which increases the photocurrent. This is because the minority carriers in the narrow bandgap absorber layer are no longer blocked from entering the depletion region. This allows background limited performance at mid-wave infrared wavelengths at the highest possible operating temperature.

Figure 5:
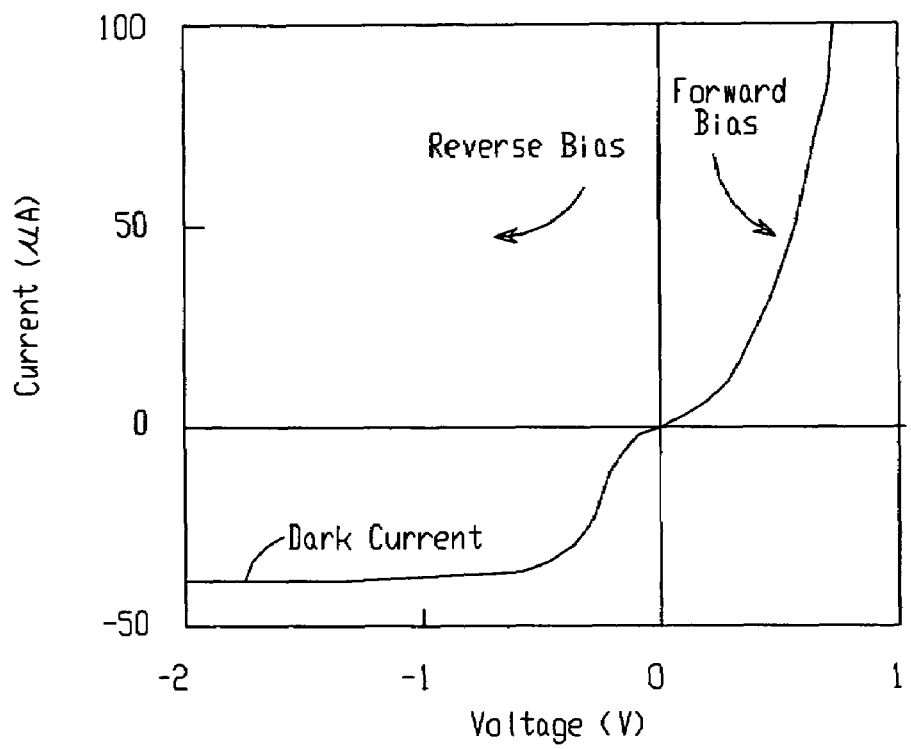
FIG. 5 is a graph which plots current versus voltage for a photodiode in accordance with the present invention.

FIG. 5 is a graph showing the current versus voltage applied between contacts 26 and 27 at room temperature for a photodiode in accordance with the present invention, with no optical illumination. Under these conditions, the reverse bias current is due to the dark current, which saturates at about −40 μA when the diode area is about $2.025 \times 10^{-3}$ cm$^2$. This gives a dark current density of 0.02 A/cm$^2$ which is very near the theoretical limit and several times better than that of a standard diode with the same area and bandgap. Hence, the current-voltage curve in FIG. 5 indicates that for a given area, a photodiode in accordance with the present invention provides much less dark current in comparison with prior art devices.

Figure 6:
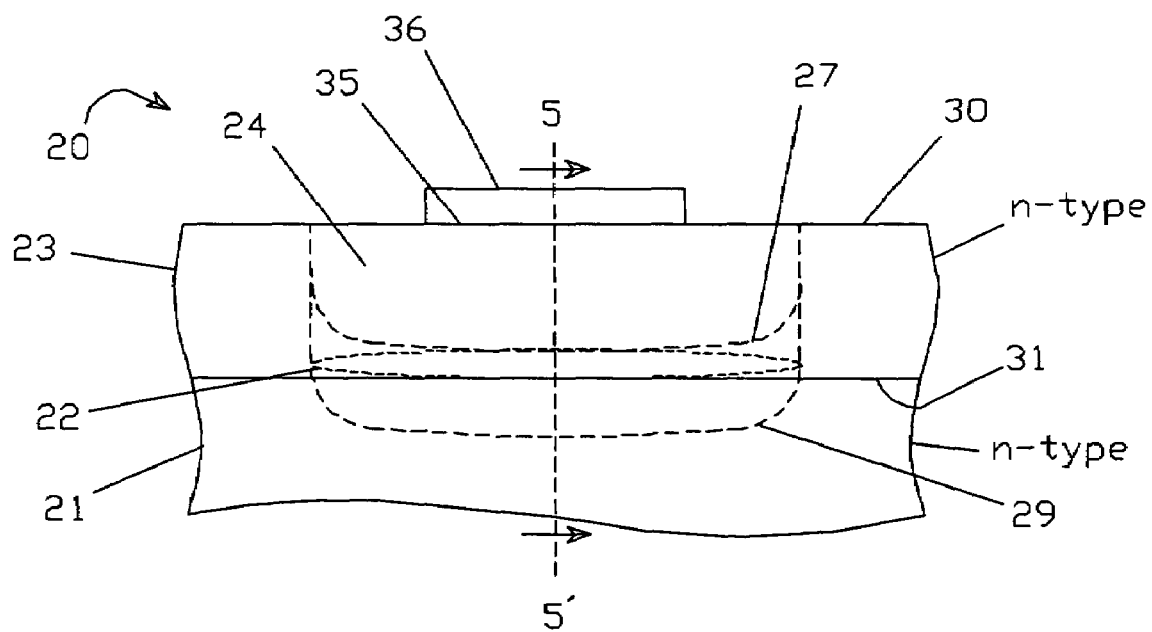
FIG. 6 is a simplified sectional view of a Schottky-barrier heterojunction photodiode with a depletion region in accordance with the present invention.

FIG. 6 is a simplified sectional view of a Schottky-barrier junction 35 in accordance with the present invention. This junction is formed by deposition of a metal or semimetal 36 on the wide band gap region 23. All layers and regions in FIG. 6 have the same meanings and assignments as those in the discussion of the pn junction implementation above.

Figure 7:
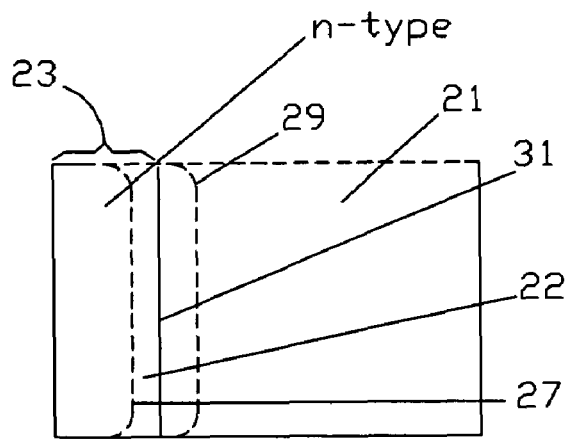
FIG. 7 is a graph showing the energy bands as a function of depth from the top surface (along line 5-5') of the device at zero and a nominal operational reverse bias condition for a Schottky-barrier version of the heterojunction photodiode of FIG. 6.
Figure 7:
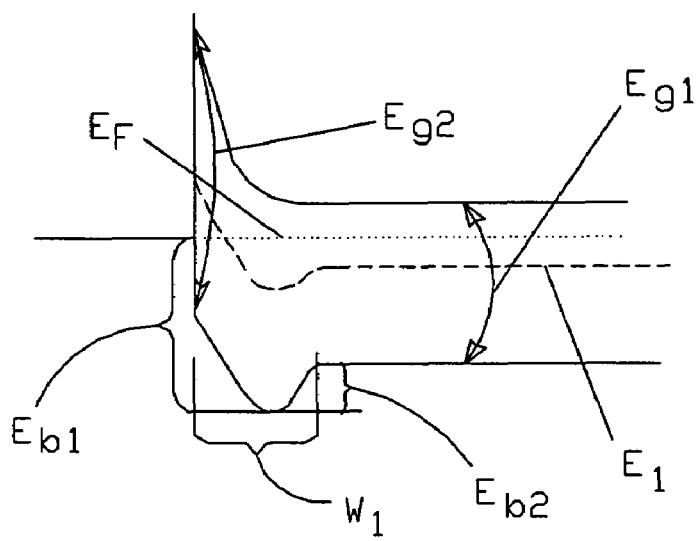
Figure 7:
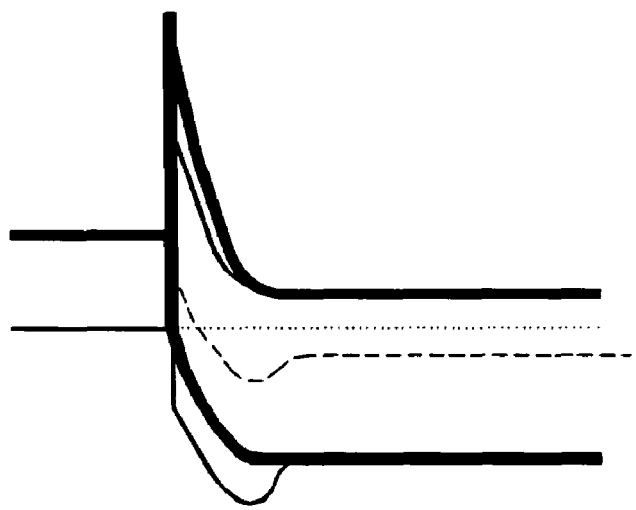

FIG. 7 is a simplified sectional view along a line 5-5' of Schottky-heterostructure diode 35 (turned 90°) in FIG. 6, and the diode's simplified energy band diagrams under zero and reverse-bias conditions. The descriptions associated with the p-n junctions and FIGS. 2-4 above may be applied to this structure as well.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A heterojunction photodiode, comprising:
a pn or Schottky-barrier junction formed in a first material region having a bandgap energy $E_{g1}$; and
a second material region having a bandgap energy $E_{g2}$ which is less than $E_{g1}$ positioned adjacent to said first material region, the material of said second material region characterized in that dark currents through said second material region are limited by fundamental Auger processes, said junction creating a depletion region in said first material region which expands towards said second material region in response to a reverse bias voltage such that the dark current flowing through said junction is reduced, said photodiode arranged such that said depletion region extends into said second material region when said reverse bias voltage is greater than a predetermined value;
wherein said photodiode is arranged such that said second material region is thin enough such that it is fully depleted by said depletion region, thereby minimizing dark currents associated with fundamental Auger processes.

2. The system of claim 1, wherein said second material region comprises mercury cadmium telluride (HgCdTe) or alloys thereof.

3. The system of claim 1, wherein said first material region comprises cadmium telluride (CdTe) or alloys thereof.

4. A heterojunction photodiode, comprising:
a pn or Schottky-barrier junction formed in a first material region having a bandgap energy $E_{g1}$; and
a second material region having a bandgap energy $E_{g2}$ which is less than $E_{g1}$ positioned adjacent to said first material region, the material of said second material region characterized in that dark currents through said second material region are limited by fundamental Auger processes, said junction creating a depletion region in said first material region which expands towards said second material region in response to a reverse bias voltage such that the dark current flowing through said junction is reduced, the photodiode arranged such that said depletion region extends into said second material region when said reverse bias voltage is greater than a predetermined value;
wherein said photodiode is arranged such that said depletion region extends into and across said second material region such that said second material region is fully depleted, thereby minimizing dark currents associated with fundamental Auger processes.

5. The system of claim 4, wherein said second material region comprises mercury cadmium telluride (HgCdTe) or alloys thereof.

6. The system of claim 4, wherein said first material region comprises cadmium telluride (CdTe) or alloys thereof.

7. An imaging system, comprising:
an array of pn or Schottky-barrier junctions formed in a first material region having a bandgap energy $E_{g1}$; and
a second material region having a bandgap energy $E_{g2}$ which is less than $E_{g1}$ positioned adjacent to said first material region, the material of said second material region characterized in that dark currents through said second material region are limited by fundamental Auger processes, each pn junction creating a depletion region in said first material region which expands towards said second material region in response to a reverse bias voltage to reduce said imaging system's dark current, said junctions arranged such that said depletion regions extend into said second material region when said reverse bias voltage is greater than a predetermined value, each of said junctions arranged such that its depletion region extends into said second material region such that said second material region is fully depleted, thereby minimizing dark currents associated with fundamental Auger processes.

8. The system of claim 7, wherein said junctions provide respective photocurrents in response to incident infrared light.

9. The system of claim 8, further including external electronic circuitry which receives said photocurrents and provides electrical output signals corresponding to an image formed on said array of pn junctions from said incident light.

10. The system of claim 7, wherein said second material region comprises mercury cadmium telluride (HgCdTe) or alloys thereof.

11. The system of claim 7, wherein said first material region comprises cadmium telluride (CdTe) or alloys thereof.

12. A heterojunction photodiode, comprising:
a pn or Schottky-barrier junction formed in a first material region, said first material region comprising cadmium telluride (CdTe) or alloys thereof and having a bandgap energy $E_{g1}$; and
a second material region positioned adjacent to said first material region, said second material region comprising mercury cadmium telluride (HgCdTe) or alloys thereof and having a bandgap energy $E_{g2}$ which is less than $E_{g1}$, said junction creating a depletion region in said first material region which expands towards said second material region in response to a reverse bias voltage such that the dark current flowing through said junction is reduced, said photodiode arranged such that said depletion region extends into said second material region when said reverse bias voltage is greater than a predetermined value;

wherein said photodiode is arranged such that said second material region is thin enough such that it is fully depleted by said depletion region, thereby minimizing dark currents associated with fundamental Auger processes.

* * * * *